(12) United States Patent
Lin et al.

(10) Patent No.: US 6,706,629 B1
(45) Date of Patent: Mar. 16, 2004

(54) BARRIER-FREE COPPER INTERCONNECT

(75) Inventors: Jing-Cheng Lin, Chu Tung Zhen (TW);
Cheng-Lin Huang, Taipei (TW);
Winston Shue, Hsinchu (TW);
Mong-Song Liang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/338,120

(22) Filed: Jan. 7, 2003

(51) Int. Cl.[7] ............. H01L 21/44; H01L 23/48
(52) U.S. Cl. ............. 438/687; 438/622; 438/654; 438/637; 438/628; 438/618; 438/625; 438/626; 438/660; 257/750; 257/751; 257/752; 257/753; 257/758; 257/762
(58) Field of Search ............. 438/687, 622, 438/654, 637, 118, 628, 618, 597, 625, 626, 627, 630, 639, 660; 257/753, 750, 758, 762, 751, 752, 774

(56) References Cited

U.S. PATENT DOCUMENTS

| | | | |
|---|---|---|---|
| 5,130,274 A | * 7/1992 | Harper et al. | 438/624 |
| 6,022,808 A | 2/2000 | Nogami et al. | 438/694 |
| 6,110,817 A | 8/2000 | Tsai et al. | 438/618 |
| 6,303,486 B1 | 10/2001 | Park | 438/618 |
| 6,346,479 B1 | 2/2002 | Woo et al. | 438/687 |
| 6,624,053 B2 | * 9/2003 | Passemard | 438/584 |
| 2001/0053602 A1 | * 12/2001 | Lee | 438/687 |
| 2002/0076925 A1 | * 6/2002 | Marieb et al. | 438/678 |
| 2002/0177303 A1 | * 11/2002 | Jiang et al. | 438/653 |
| 2003/0190829 A1 | * 10/2003 | Brennan | 439/200 |

OTHER PUBLICATIONS

Ueno, K. et al., A high reliability copper dual–damascene interconnection with direct–contact via structure, 2000, IEDM Technical Digest. PP 265–268.*

* cited by examiner

*Primary Examiner*—Matthew Smith
*Assistant Examiner*—B V Keshavan
(74) *Attorney, Agent, or Firm*—George O. Saile; Stephen B. Ackerman

(57) ABSTRACT

A new method is provided is creating metal interconnect comprising copper. A first embodiment of the invention provides for the application of a doped layer of copper. A second embodiment of the invention provides for the deposition of a silicon nitride layer as an inter-barrier film over surfaces of an opening created in a layer of dielectric followed by removing the layer of silicon nitride from the bottom of the opening followed by depositing a doped copper-alloy seed layer over surfaces of the opening followed by plating a layer of copper over the copper-alloy seed layer.

47 Claims, 6 Drawing Sheets

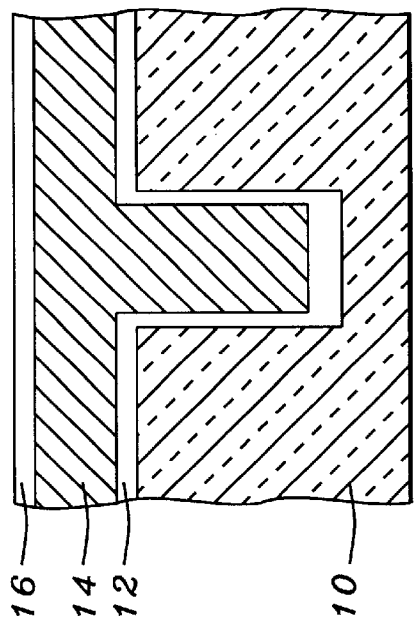
FIG. 1
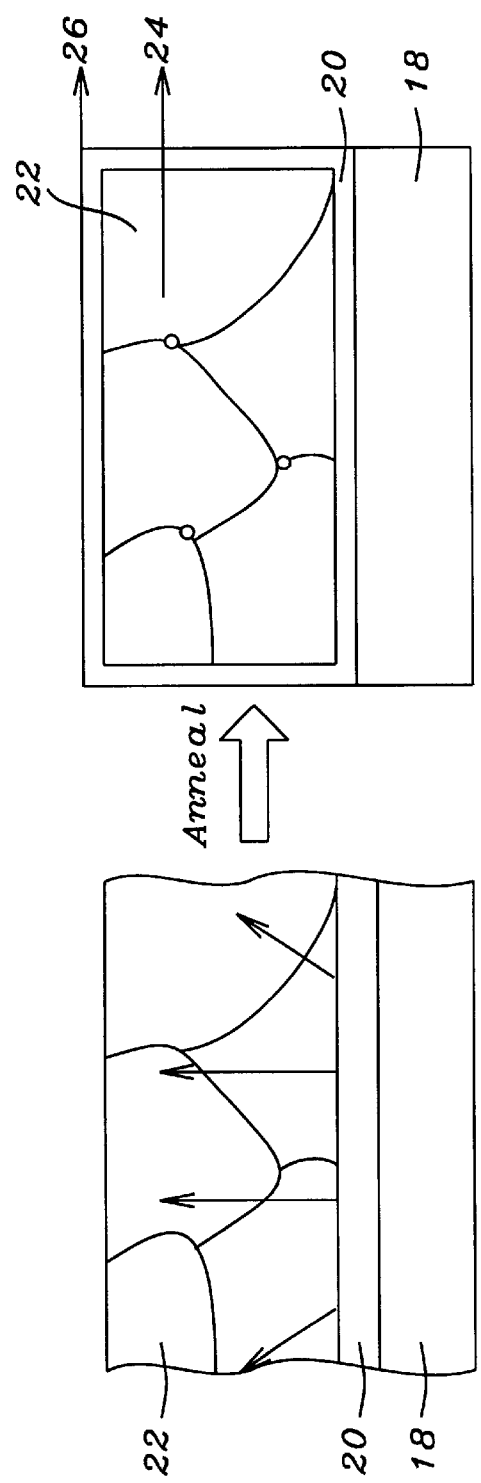
FIG. 2a
FIG. 2b

*FIG. 3a - Prior Art*

BARRIER-FREE COPPER INTERCONNECT

BACKGROUND OF THE INVENTION (1) Field of the Invention

The invention relates to the fabrication of integrated circuit devices, and more particularly, to a method that allows creating layers of interconnect metal containing copper without the use of a conventional barrier layer.

(2) Description of the Prior Art

Semiconductor device performance improvements are typically achieved by device miniaturization and by increasing the packaging density of created semiconductor packages. With the continued decrease in device dimensions, device interconnect methods and materials are becoming an increasingly more importance part of creating packaged semiconductor devices.

The selection of insulation materials and the selection of the materials that are used for the creation of interconnect metal continue to be explored as part of a continuing effort to improve device performance. In this respect for instance methods and materials are explored that allow for the creation of low-k dielectric interfaces between adjacent layers of interconnect metal. In addition, the materials that are used for the creation of the interconnect metal, such as interconnect vias and interconnect traces, continues to present a challenge.

For the use as an interconnect medium, copper has increasingly gained acceptance and is increasingly used for this purpose. Copper is known to have a relatively low cost and a low resistivity, copper however has a relatively large diffusion coefficient into silicon dioxide and silicon. Copper from an interconnect may diffuse into a surrounding silicon dioxide layer, causing the dielectric to become conductive and decreasing the dielectric strength of the silicon dioxide layer. Copper interconnects are therefore conventionally encapsulated by at least one layer of diffusion barrier material that prevents diffusion of the copper into the surrounding dielectric such as a layer of silicon dioxide. Silicon nitride is frequently used as a diffusion barrier layer for copper, the disadvantage of this approach is that metal interconnects preferably should not lie over a silicon nitride layer since the silicon nitride layer has a relatively high dielectric constant when compared with silicon dioxide, causing an undesirable increase in the capacitance between the interconnect metal and the underlying substrate. Copper is also known to have low adhesive strength to various insulating layers and is difficult to pattern by masking and etching a blanket layer of copper in order to create intricate structural circuit elements.

To create conductive interconnect lines and vias, the damascene or dual damascene process is frequently used. For the creation of Very and Ultra Large Scale Integrated devices using the dual damascene process, a layer of insulating or dielectric material is patterned and developed, creating several thousand openings there-through for conductive interconnect traces and vias. These openings are simultaneously filled with a metal, conventionally aluminum with more recently developments using copper, the in this manner created metal interconnects serve to interconnect active and/or passive elements of the integrated circuit.

Damascene is an interconnection fabrication process in which grooves are formed in an insulating layer and filled with metal to form the conductive lines. Dual damascene is a multi-level interconnection process in which, in-addition to forming the grooves of single damascene, conductive via openings also are formed.

The invention concentrates on using copper as a metal interconnect medium, whereby the cost incurred by using copper can be reduced by eliminating the need for a conventional barrier layer. In addition, smooth sidewalls of the deposited copper can be obtained, reducing contact resistance. Porous sidewalls between the created copper layer and surrounding low-k dielectric are sealed, bonding between the created copper metal and the underlying interface is improved.

U.S. Pat. No. 6,110,817 (Tsai et al.) shows a carbon doped, copper containing interconnect.

U.S. Pat. No. 6,022,808 (Nogami et al.) shows a copper interconnect with doped copper for reduced electromigration.

U.S. Pat. No. 6,303,486 B1 (Park) reveals a copper interconnect process.

U.S. Pat. No. 6,346,479 B1 (Woo et al.) discloses a copper interconnect with doped copper.

SUMMARY OF THE INVENTION

A principle objective of the invention is to remove the need for a barrier layer that conventionally surrounds a deposited layer of copper.

Another objective of the invention is to smooth the sidewalls of a created layer of copper interconnect metal.

Yet another objective of the invention is to seal-off a porous interface between a deposited layer of copper and an underlying layer of semiconductor material.

A still further objective of the invention is to provide a method of creating copper interconnects such that yield and reliability performance are improved over conventional methods of creating copper interconnects.

In accordance with the objectives of the invention a new method is provided is creating metal interconnect comprising copper. A first embodiment of the invention provides for the application of a doped layer of copper. A second embodiment of the invention provides for the deposition of a silicon nitride layer as an inter-barrier film over surfaces of an opening created in a layer of dielectric followed by removing the layer of silicon nitride from the bottom of the opening followed by depositing a doped copper-alloy seed layer over surfaces of the opening followed by plating a layer of copper over the copper-alloy seed layer.

BRIEF DESCRIPTION OF THE DRAWINGS

FIG. 1 is a cross section of a created pattern of copper for considerations of doping potential.

FIGS. 2a and 2b show annealing effects of a copper doped layer.

FIG. 3a shows a cross section of a conventionally created copper interconnect.

FIG. 5 shows a cross section of layers of dielectric created over the surface of a metal-1 copper interconnect, the layer of etch stop material overlying the metal-12 copper interconnect is overlying the metal-1 copper interconnect.

FIG. 6 shows a cross section after deposition of a layer of SiN or SiO or SiC or SiON.

FIG. 7 shows a cross section after the layers of etch stop material and SiN or SiO or SiC or SiON have been removed from the surface of the metal-1 copper interconnect.

FIG. 8 shows a cross section after the deposition of a copper alloy.

FIG. 9 shows a cross section after copper plating for the creation of a copper damascene structure.

FIG. 10 shows a cross section after anneal and after the step of CMP.

DESCRIPTION OF THE PREFERRED EMBODIMENTS

Figure 3B:
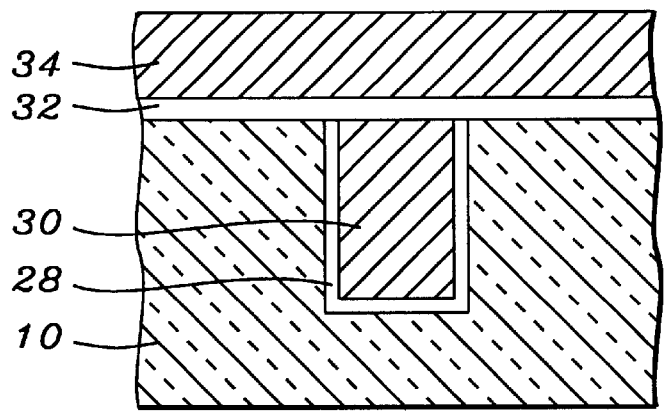
FIGS. 3b through 3d show cross sections of the first embodiment of the invention for the creation of a copper interconnect.
Figure 3B:
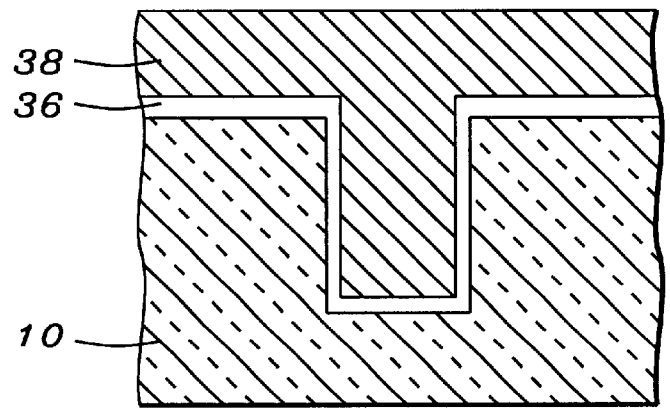

For the creation of layers of patterns-of interconnect metal aluminum, which has been the material of choice since the integrated circuit art began, is becoming less attractive and is gradually being replaced by other interconnect metals such as copper, gold, and silver. These materials provide significantly improved electrical conductivity and are also more resistant than aluminum to electromigration, which is an aspect of the interconnect medium that becomes increasingly more important as device dimensions decrease and as wire widths are correspondingly reduced. The metals in question continue to be researched for application thereof for the creation of interconnect metal. A number of disadvantages must thereby be overcome, such as formation of undesirable inter-metallic alloys and/or the formation of recombination centers in other parts of the integrated circuit, while the relatively low diffusion rates of these metals must be accommodated. Copper additionally has the disadvantage of being readily oxidized at relatively low temperatures. Copper however is at this time considered a promising replacement for aluminum due to its low cost and ease of processing.

The essential element of creating a copper interconnect that is addressed by the invention is the elimination of the conventional barrier layer. Conventionally, a barrier layer of TaN is used to surround a patterned layer of copper interconnect, serving as a barrier layer for the layer of copper interconnect. However, a layer of TaN introduces increased resistance in the interface between the copper interconnect and surrounding elements, resulting in increasing contact resistance and series resistance of the copper interconnect. These negative effects that are introduced by using a layer of TaN as a barrier layer will become more pronounced with further shrinkage of device features and device interconnects. Methods must therefore be provided for the use of copper as an interconnect medium while at the same time not increasing contact resistance and series resistance of the created copper interconnect. The invention provides such methods by providing:

1. A first embodiment of the invention provided by applying a doped layer of copper over surfaces of a created opening, whereby as doping elements can be used for instance Cr, Pd, Sn, Ti, Zr, Mg, Al and Co or any other copper oxidation inhibiting material, and
2. A second embodiment of the invention provided by:
   applying an inter-barrier layer of SiN or SiO or SiC or SiON over surfaces of an opening that has been created in a surrounding layer of dielectric for the purpose of creating a copper interconnect therein
   removing the inter-barrier from the bottom of the opening
   depositing a doped copper alloy seed layer over the surfaces of the opening including the bottom of the opening and
   filling the opening with copper by a process of plating.

A first embodiment of the invention of provided a doped layer of copper over surfaces of a created opening can comprise:
   methods of providing a copper doped layer over inside surfaces of an opening, and
   methods of providing doping during plating of a layer of copper layer.

As part of the invention and reflecting initial considerations in selecting an optimum method of the invention, the cross section that is shown in FIG. 1 will first be discussed.

The cross section of FIG. 1 shows a layer 10 of dielectric material in the surface of which an opening has been created, a layer of copper interconnect metal is to be created in the opening created through the layer 10 of dielectric.

Two methods of doping copper that form part of the copper interconnect metal can be considered and have been shown in the cross section of FIG. 1. Layer 12 is a doped seed layer for the copper interconnect metal 14 and layer 16, which is a cap layer of doped copper. The essential body of the copper interconnect is highlighted as layer 14 which provides the bulk of the copper, considered un-doped copper, that constitutes the copper interconnect.

In considering an optimum method to provide a copper interconnect having low series resistance and low contact resistance, the following factors as they relate to the cross section of FIG. 1 have been considered. These factors are reasons for selecting the seed layer 12 as the optimum manner in achieving the stated objectives of low series resistance and low contact resistance:

1. The seed layer 12 is easier to provide considering that the method of creating this layer is preferred to be a method of physical CVD (PVD)
2. The composition of a seed layer 12, as opposed to a cap layer 16, is easier to control
3. The creation of a seed layer 12 can be achieved with minimum impact on the processing time of creating a copper interconnect
4. The seed layer 12 is less prone to form uneven distribution or agglomeration of the seed layer 12 over the surface over which the seed layer 12 is created and therefore forms a continuous layer of doped copper over which gap fill can be performed, and
5. A copper-doped seed layer enhances wettability between the underlying layer and the copper fill that is plated over the seed layer.

The basic process that occurs as a result of providing a copper doped layer and bringing this copper doped layer in direct contact with a layer of copper is shown in the cross sections of FIGS. 2a and 2b. Shown in the cross section of FIG. 2a is a substrate 18 over the surface of which a layer 20 of copper doped material has been deposited. The copper that conventionally forms the bulk of a copper interconnect is shown in cross-section in layer 22 of FIG. 2a. The cross-section shown in FIG. 2a is a cross-section of the created layers before a thermal anneal is performed to these layers. The thermal anneal, the results of which are shown in FIG. 2b, enhances the mobility of for instance the doping elements and therefore enhances the migration of these doping elements across layer boundaries. If for instance layer 20 is a Mg doped layer, the Mg atoms will form chemical compounds such as the compound 24 of $Cu_xM_y$ while the Mg combines with the oxygen over the surface of the layer 22 of copper to form the compound 26 of $M_xO_y$. The end result of the doping of the copper layer 20 and the there-after applied process of anneal is that an improved interface is created between the copper of layer 22 and surrounding surfaces. At the same time a protective layer 26 is formed over the surface of the layer 22 of copper.

The steps of creating a doped layer of copper surrounding a copper interconnect are now shown using FIGS. 3a through 3d for this purpose.

As a first cross section is shown the cross section of FIG. 3a, which is the conventional method of creating a barrier layer surrounding a copper interconnect. An opening has been created in the layer 10 of dielectric, a barrier layer 28 conventionally comprising TaN has been deposited over the surfaces of the opening created in the surface of layer 10 of dielectric. Copper interconnect 30 has been created overlying the barrier layer 28, using conventional methods of metal deposition and polishing for the purpose of removing excess copper from the surface of layer 10 of dielectric. An etch stop layer 32 is then typically provided over the surface of layer 10 of dielectric, overlying the surface of copper interconnect 30, after which the process of creating a semiconductor device can proceed with the deposition of a layer 34 of for instance IMD.

The first embodiment of the invention, FIG. 3b, starts with a layer 10 of dielectric over the surface of a substrate (not shown) and creates an opening in the surface of the layer 10 of dielectric for the purpose of creating a copper interconnect therein.

The invention then deposits a doped layer 36 of copper over inside surface of the opening created in the surface of layer 10 of dielectric after which a layer 38 of copper is plated over the surface of the layer 36 of doped copper.

Figure 3C:
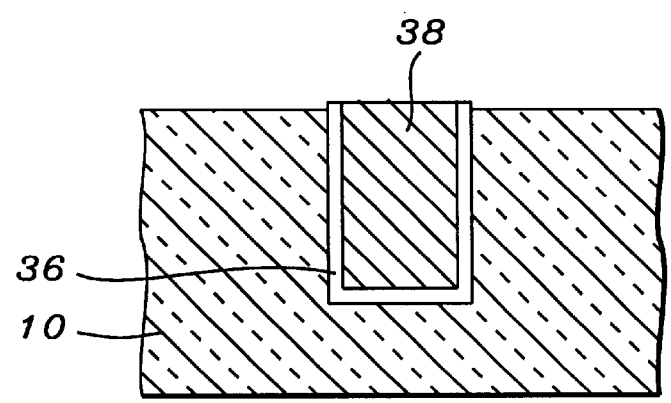

The layer 38, FIG. 3c, is now removed from the surface of the layer 10 of dielectric, using methods of for instance Chemical Mechanical Polishing (CMP), whereby the doped layer 36 of copper is also removed from the surface of layer 10 of dielectric.

Figure 3D:
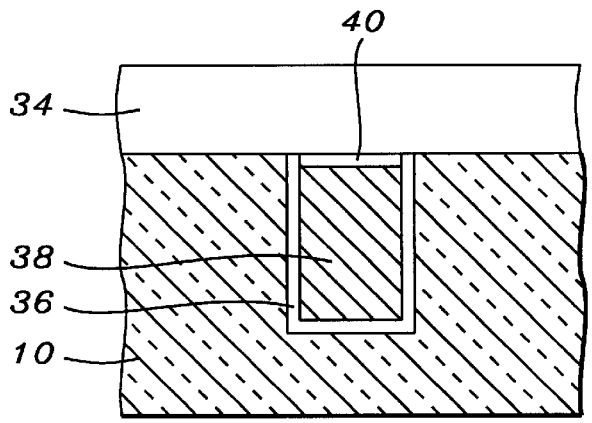

A layer 40, FIG. 3d of copper-doped oxide is then created over the exposed surface of copper interconnect 38 after which the process of creating a copper interconnect can be terminated with the deposition of a layer 34 of for in stance IMD. The layer 40 of copper doped oxide can be formed to a thickness of between about 150 Angstrom through exposing the surface of copper interconnect 36 to a thermal oxidation environment at a temperature of about 200 to 400 degrees C. for a time period of about 5 to 20 minutes.

The layer 40 of copper-doped oxide may also be created as a result of the deposition of a oxide based layer 34 of dielectric over the surface of the first layer 10 of dielectric. Chemical interaction between the two layer 38 of copper and the layer 34 of dielectric where these layers are in contact with each other and surface residue of the copper doped layer 38 will result in the creation of a copper doped oxide layer 40.

The processing step of anneal has not been indicated in the sequence highlighted in the cross sections of FIGS. 3b through 3d, since this step may be applied but is not essential for the invention.

Experimental results have been obtained of the effect of a thermal anneal on copper and copper that is doped with selected substances. Copper in undoped form has been presented for purposes of comparison, further selected have been doped layers of CuMg and CuZr.

Figure 4:
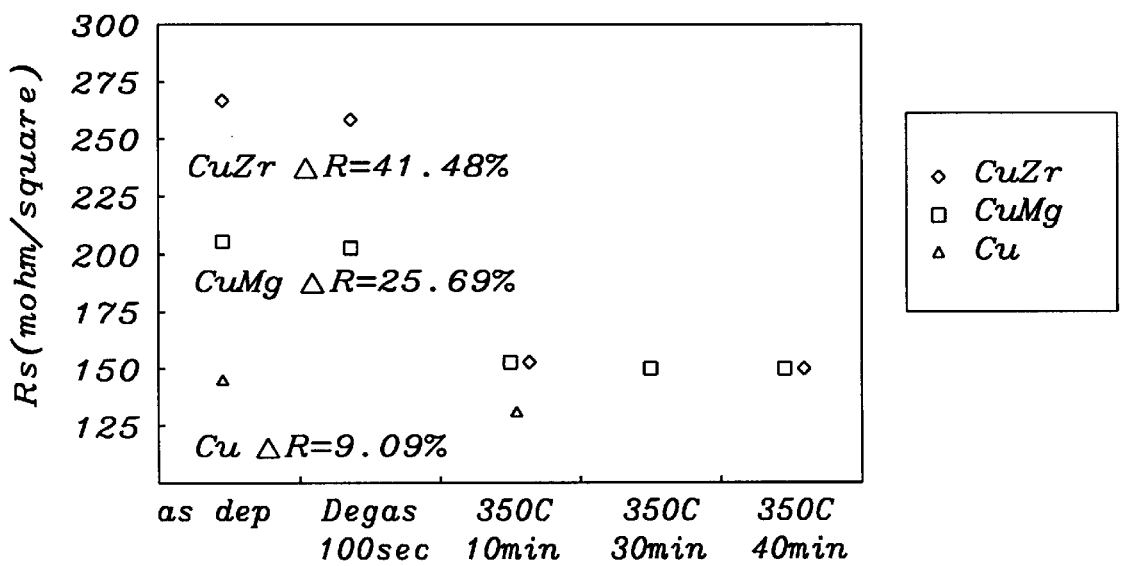
FIG. 4 shows a graph of annealing effects on the series resistance of copper and copper alloys.

From the graphic display shown in FIG. 4 it can be observed that:

A layer of CuZr surrounding a copper interconnect such as layer 36, FIG. 3d, results in a reduction of the series resistance of about 41.48%. That is at the time of degassing of the layer of CuZr the resistance in Mohm/square is measured as being 270 Mohm/square, as a temperature of for instance 350 degrees C. applied for a time of 10 minutes the Rs has decreased to a value of 150 Mohm/square, a reduction of 120 Mohm/square or 120/270×100%=41.48%

For CuMg doped layer and following the same reasoning, a reduction of 25.69% is accomplished For undoped copper, a reduction of 9.09% is accomplished by applying conditions of anneals as indicated in the graphic depiction of FIG. 4.

The second embodiment of the invention is now described using FIGS. 5 through 10 for this purpose.

Figure 5:
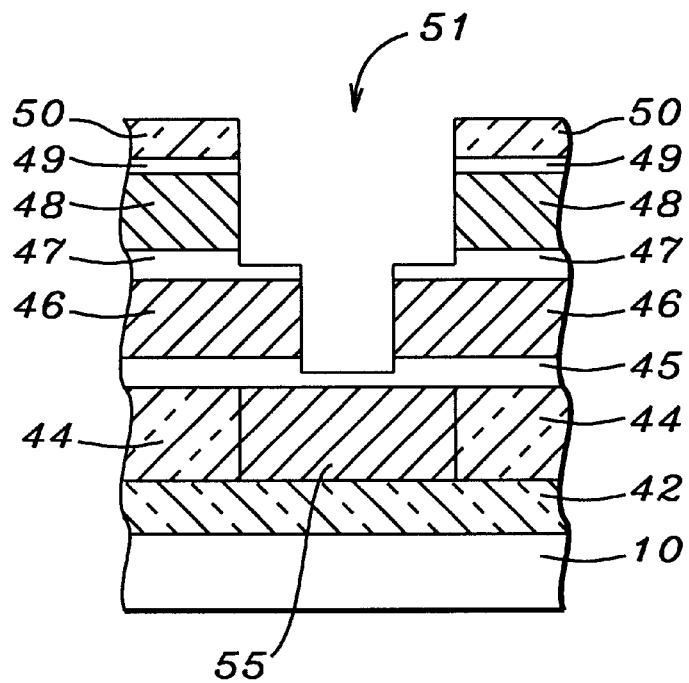
FIGS. 5 through 10 shows cross sections relating to the second embodiment of the invention, as follows.

Shown in the cross section of FIG. 5 are multiple overlying layers of dielectric separated by multiple layers of etch stop material, created for the purpose of providing a metal interconnect of copper there-through, as follows:

layer 10 is the surface of a substrate over the surface of which a copper interconnect is to be created layer 42 is a layer of pad oxide layers 44, 46 and 48 are respectively a first, a second and a third layer of dielectric layers 45, 47 and 49 are respectively a first, a second and a third layer of etch stop material, and 50, a final layer of for instance IMD.

The structure that is shown in cross section in FIG. 5 is created applying conventional methods of semiconductor material deposition, patterning and etching, opening 51 through multiple of these layers is created in like, conventional manner. Opening 51 is created for the purpose of creating a copper interconnect layer therein. This created copper interconnect layer is created with the objective of electrically interconnecting with the metal-1 interconnect 55 of copper that has been created in first layer 44 of dielectric.

It must be noted in the cross section of FIG. 5 that the layer 45 of etch stop material is as yet in place and overlying the surface of layer 55 of copper. The cross section that is shown in FIG. 5 therefore represents the "before-breakthrough" (to the copper interconnect 55) status of creating the copper interconnect of the invention.

Figure 6:
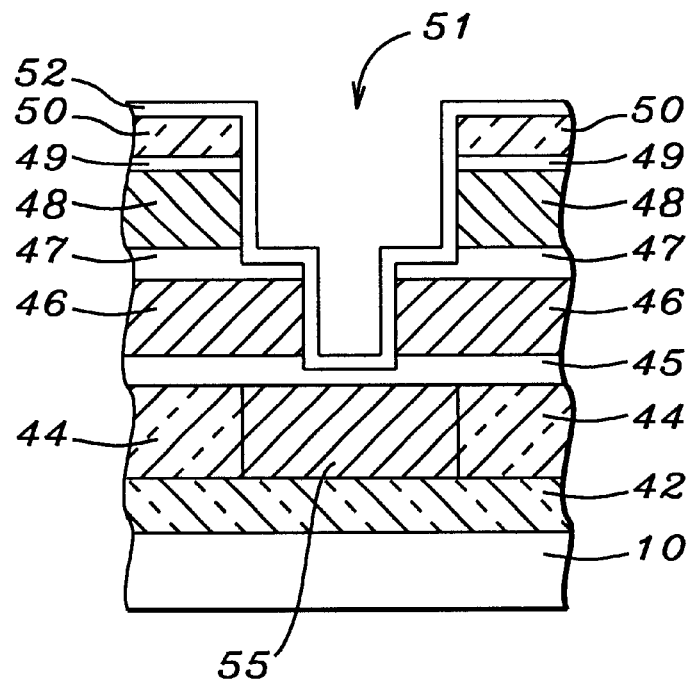
Figure 7:
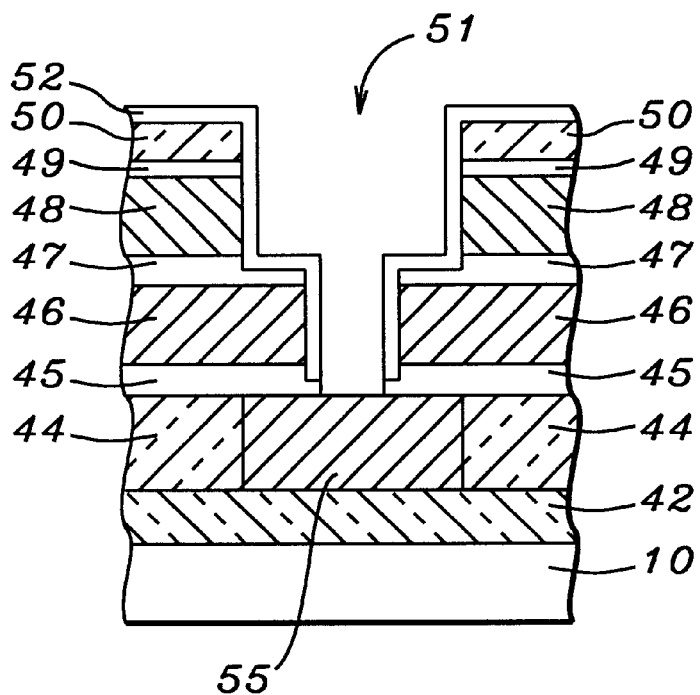

FIG. 6 shows a cross section after a thin layer 52 of SiN or Sib or SiC or SiON has been deposited over the exposed surfaces of the structure that has been shown in cross section in FIG. 5. The thin layer of SiN or SiO or SiC or SiON is next, FIG. 7, removed from the bottom of the opening 51 in addition to which the layer 45 of etch stop material is also removed from under the bottom surface of opening 51, resulting in the cross section that is shown in FIG. 7.

Figure 8:
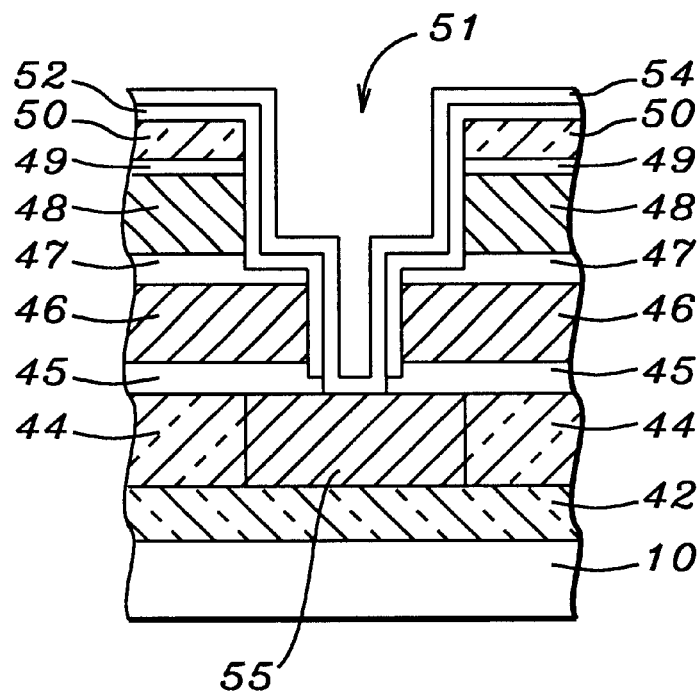

Next, a copper alloy layer 54, FIG. 8, is deposited. As copper alloys for the deposited layer 54 can be cited CuCr, CuPd, CuSn, CuMg, CuAl, CuCo and CuZr. Most significantly, the deposited layer 54 of copper alloy is in physical contact, layer 56 in FIG. 8, with the copper interconnect 55 over the surface thereof.

Figure 9:
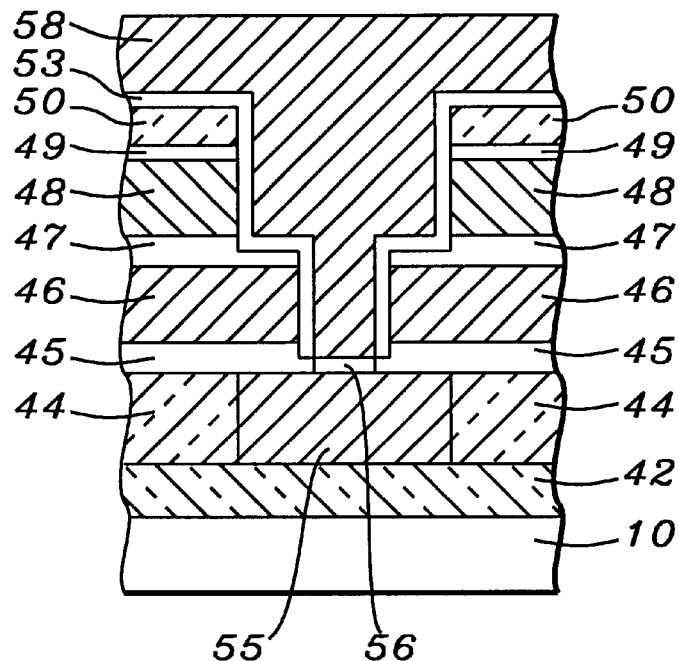

Opening 51, FIG. 8, is now filled by applying copper plating 58 over the surface of the structure shown in cross section in FIG. 8, resulting in the cross section shown in FIG. 9. At this time in the process, the structure can be annealed as a result of which the copper doped elements contained in layer 54, FIG. 8, interact with the SiN or SiO or SiC or SiON of layer 52, FIG. 8, to form chemical compounds such a MgN, ZrN, ZrO, ZrC, ZrON, SnN, SnO, SnC, SnCN and the like, compounds which effectively act as a barrier layer to the plated layer 58 of copper. This barrier layer has been highlighted as compound barrier layer 53 in the cross section of FIG. 9.

Figure 10:
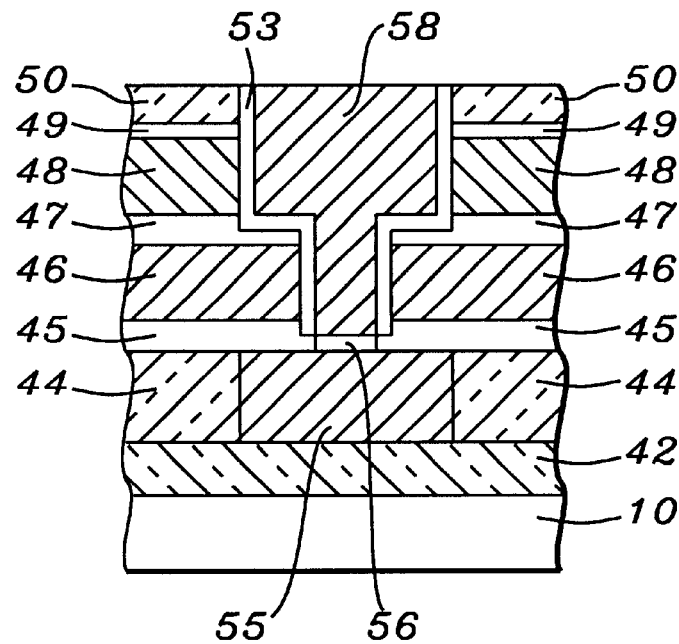

By now removing excess copper 58 from the surface of the layers of etch stop material and dielectric, the cross section shown in FIG. 10 is obtained. Conventional methods of CMP may be applied for this purpose, it will be observed in the cross section that is shown in FIG. 10 that for instance layer 50 of IMD and layer 49 of etch stop material have been removed from above the surface of layer 48 of dielectric.

To summarize the invention, the first embodiment of the invention:

provides a layer of dielectric over the surface of a substrate creates an opening in the surface of the layer of dielectric for the purpose of creating a copper interconnect therein deposits a doped layer of copper over inside surface of the opening created in the surface of layer of dielectric after which a layer of copper is plated over the surface of the layer of doped copper excess copper is removed from the surface of the layer of dielectric, the doped layer of copper is also removed from the surface of layer of dielectric a layer of copper-doped oxide is then created over the exposed surface of copper interconnect, after which the process of creating a copper interconnect can be terminated with the deposition of a layer of for instance IMD.

The second embodiment of the invention provides:

multiple overlying layers of dielectric separated by multiple layers of etch stop material, an opening has been created there-through for the purpose of providing a metal interconnect of copper overlying a copper interconnect a layer of etch stop material is as yet in place overlying the surface of the copper interconnect a thin layer of SiN or SiO or SiC or SiON is deposited over the exposed surfaces of the structure the thin layer of SiN or SiO or SiC or SiON is removed from above the copper interconnect in addition to which the layer of etch stop material is removed from above the copper interconnect a copper alloy layer is deposited over inside surfaces of the opening the opening is filled with copper annealed can be applied, and excess copper is removed from the surface of the layers of etch stop material and dielectric.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for the creation of a barrier-free copper interconnect, comprising steps of:

providing a semiconductor substrate, a first layer of dielectric having been provided over said substrate, said first layer of dielectric having been provided with an opening therein for creation of a copper interconnect;

depositing a layer of doped copper over inside surfaces of said opening;

depositing a layer of copper over said layer of doped copper; and creating a layer of doped copper oxide over said layer of copper.

2. The method of claim 1, additionally depositing a second layer of dielectric over said first layer of dielectric, thereby including said layer of doped copper oxide created over said layer of copper.

3. The method of claim 1, additionally applying a step of anneal.

4. The method of claim 3, said anneal comprising applying a temperature of no less than about 350 degrees C. for a time of no less than about 10 minutes, thereby creating a diffusion barrier surrounding and a top protective layer overlying said copper interconnect.

5. The method of claim 1, said layer of doped copper comprising doping copper with a copper oxidation inhibiting material.

6. The method of claim 1, said layer of doped copper comprising copper doped with a material selected from the group consisting of Cr, Pd, Sn, Ti, Zr, Mg, Al and Co.

7. The method of claim 1, said depositing a layer of doped copper over inside surfaces of said opening comprising methods of depositing a layer of copper having been doped prior to deposition.

8. The method of claim 1, said depositing a layer of doped copper over inside surfaces of said opening comprising methods of doping during plating of a layer of copper layer.

9. The method of claim 1, said creating a layer of doped copper oxide over said layer of copper comprising methods of copper oxidation.

10. The method of claim 9, said methods of copper oxidation comprising exposing said layer of copper deposited over said doped copper layer to a thermal oxidation environment at a temperature of about 200 to 400 degrees C. for a time period of about 5 to 20 minutes.

11. A method for the creation of a barrier-free copper interconnect, comprising steps of:

providing a semiconductor substrate, at least one copper point of contact having been provided over said substrate, at least one stack of layers comprising a first layer of etch stop material over which a second layer of dielectric has been deposited having been deposited over said substrate thereby including said at least one copper point of contact having been provided over said substrate, at least one opening having been created through said at least one stack of layers, said at least one opening being aligned with said at least one copper point of contact having been over said substrate, said at least one opening further exposing said first layer of etch stop material comprised in said at least one stack of layers;

depositing a layer of passivation material over inside surfaces of said at least one opening having been created through said at least one stack of layers;

removing said deposited layer of passivation material and said exposed first layer of etch stop material comprised in said at least one stack of layers from a bottom surface of said at least one opening having been created through said at least one stack of layers, thereby exposing said at least one copper point of contact having been provided over said substrate;

depositing a seed layer over inside surfaces of said at least one opening having been created through said at least one stack of layers;

depositing a layer of copper over said seed layer;

performing an anneal; and removing excess copper from said at least one stack of layers.

12. The method of claim 11, said substrate additionally having been provided with a layer of pad oxide over the surface thereof.

13. The method of claim 12, said substrate additionally having been provided with a layer etch stop material, said layer of etch stop material having been provided over said layer of pad oxide.

14. The method of claim 11, said anneal comprising applying a temperature of no less than about 350 degrees C. for a time of no less than about 10 minutes, thereby creating a diffusion barrier surrounding said copper interconnect.

15. The method of claim 11, said seed layer comprising copper doped with a copper oxidation inhibiting material.

16. The method of claim 11, said seed layer comprising copper doped with a material selected from the group consisting of Cr and Pd and Sn and Ti and Zr and Mg and Al and Co.

17. The method of claim 11, said depositing a seed layer over inside surfaces of said at least one opening comprising methods of providing a layer of copper having been doped prior to deposition thereof.

18. The method of claim 11, said depositing a seed layer over inside surfaces of said at least one opening comprising methods of doping during plating of a layer of copper.

19. The method of claim 11, said layer of passivation material comprising a material selected from the group consisting of silicon nitride, SiO, SiC and SiON.

20. A method for the creation of a barrier-free copper interconnect, comprising steps of:
providing a semiconductor substrate, at least one opening having been created through a stack of layers of semiconductor material for the purpose of creating a copper interconnect in said at least one opening;
depositing a layer of passivation material over inside surfaces of said at least one opening;
depositing a copper doped seed layer over said layer of passivation material;
depositing a layer of copper over said seed layer;
performing an anneal; and
removing excess copper from above said at least one opening and surrounding surfaces, thereby creating a copper interconnect.

21. The method of claim 20, said substrate additionally having been provided with a layer of pad oxide over the surface thereof.

22. The method of claim 21, said substrate additionally having been provided with a layer etch stop material, said layer of etch stop material having been provided over said layer of pad oxide.

23. The method of claim 20, said anneal comprising applying a temperature of no less than about 350 degrees C. for a time of no less than about 10 minutes, thereby creating a diffusion barrier surrounding and a top protective layer overlying said copper interconnect.

24. The method of claim 20, said copper doped seed layer comprising copper doped with a copper oxidation inhibiting material.

25. The method of claim 20, said copper doped seed layer comprising copper doped with a material selected from the group consisting of Cr and Pd and Sn and Ti and Zr and Mg and Al and Co.

26. The method of claim 20, said depositing a copper doped seed layer over inside surfaces of said opening comprising methods of providing a layer of copper doped material having been doped prior to deposition thereof.

27. The method of claim 20, said depositing a copper doped seed layer over inside surfaces of said opening comprising methods of doping during plating of a layer of copper.

28. The method of claim 20, said layer of passivation material comprising a material selected from the group consisting of silicon nitride, SiO, SiC and SiON.

29. The method of claim 20, additionally depositing a second layer of dielectric over said at least one stack of layers, thereby including said created copper interconnect.

30. The method of claim 29, said second layer of dielectric being an oxide based layer of dielectric.

31. A barrier-free copper interconnect, comprising:
a semiconductor substrate, a first layer of dielectric over said substrate, said first layer of dielectric having an opening therein for a copper interconnect;
a layer of doped copper over sidewalls of said opening;
a layer of copper over said layer of doped copper; and
a layer of doped copper oxide over said layer of copper to complete said copper interconnect.

32. The barrier-free copper interconnect of claim 31, additionally comprising a second layer of dielectric over said first layer of dielectric, thereby including said layer of doped copper oxide.

33. The barrier-free copper interconnect of claim 31, said layer of doped copper comprising copper doped with a copper oxidation inhibiting material.

34. Barrier-free copper interconnect of claim 31, said layer of doped copper comprising copper doped with a material selected from the group consisting of Cr, Pd, Sn, Ti, Zr, Mg, Al and Co.

35. A barrier-free copper interconnect, comprising:
a semiconductor substrate, at least one copper point of contact over said substrate, at least one stack of layers comprising a first layer of etch stop material over which a second layer of dielectric over said substrate thereby including said at least one copper point of contact, at least one opening through said at least one stack of layers aligned with said at least one copper point of contact, said at least one opening exposing said first layer of etch stop material;
a layer of passivation material over sidewalls of said at least one opening;
a seed layer over sidewalls of said at least one opening; and
a layer of copper over said seed layer.

36. The barrier-free copper interconnect of claim 35, said substrate additionally comprising a layer of pad oxide over the surface thereof.

37. The barrier-free copper interconnect 36, said substrate additionally comprising a layer etch stop material over said layer of pad oxide.

38. The barrier-free copper interconnect of claim 35, said seed layer comprising copper doped with a copper oxidation inhibiting material.

39. The barrier-free copper interconnect of claim 35, said seed layer comprising copper doped with a material selected from the group consisting of Cr and Pd and Sn and Ti and Zr and Mg and Al and Co.

40. The barrier-free copper interconnect of claim 35, said layer of passivation material comprising silicon nitride, SiO, SiC or SiON.

41. A barrier-free copper interconnect, comprising:
a semiconductor substrate, at least one opening having been provided through a stack of layers of semiconductor material;
a layer of passivation material over inside surfaces of said at least one opening;
a copper doped seed layer over said layer of passivation material; and
a layer of copper over said seed layer.

42. The barrier-free copper interconnect of claim 41, said substrate additionally comprising a layer of pad oxide over the surface thereof.

43. The barrier-free copper interconnect of claim 42, said substrate additionally comprising a layer etch stop material over said layer of pad oxide.

44. The barrier-free copper interconnect of claim 42, said copper doped seed layer comprising copper doped with a copper oxidation inhibiting material.

45. The barrier-free copper interconnect of claim 42, said copper doped seed layer comprising copper doped with a material selected from the group consisting of Cr and Pd and Sn and Ti and Zr and Mg and Al and Co.

46. The barrier-free copper interconnect of claim 42, said layer of passivation material comprising a material selected from the group consisting of silicon nitride, SiO, SiC and SiON.

47. The barrier-free copper interconnect of claim 42, additionally comprising a second layer of dielectric over said at least one stack of layers, thereby including said created copper interconnect.

* * * * *